(12) United States Patent
Kajiyama et al.

(10) Patent No.: US 8,994,635 B2
(45) Date of Patent: Mar. 31, 2015

(54) DISPLAY DEVICE

(75) Inventors: Kenta Kajiyama, Mobara (JP); Takeshi Izumida, Mobara (JP); Norihiro Nakamura, Mobara (JP); Naoki Tokuda, Mobara (JP)

(73) Assignees: Japan Display Inc., Tokyo (JP); Panasonic Liquid Crystal Display Co., Ltd., Himeji-Shi, Hyogo-Ken (JP)

( * ) Notice: Subject to any disclaimer, the term of this patent is extended or adjusted under 35 U.S.C. 154(b) by 987 days.

(21) Appl. No.: 12/478,861

(22) Filed: Jun. 5, 2009

(65) Prior Publication Data

US 2009/0303164 A1 Dec. 10, 2009

(30) Foreign Application Priority Data

Jun. 6, 2008 (JP) ................. 2008-149729

(51) Int. Cl.
*G09G 3/30* (2006.01)
*H01L 27/32* (2006.01)
*G09G 3/32* (2006.01)

(52) U.S. Cl.
CPC .......... *H01L 27/3276* (2013.01); *G09G 3/3233* (2013.01); *G09G 2300/0852* (2013.01); *G09G 2310/0218* (2013.01); *G09G 2310/0251* (2013.01); *H01L 27/3262* (2013.01)
USPC ................. 345/100; 345/76; 345/77; 345/78; 345/79; 345/80; 345/81; 345/82; 345/83; 345/84; 345/85; 345/86; 345/87; 345/88; 345/89; 345/90; 345/91; 345/92; 345/93; 345/94; 345/95; 345/96; 345/97; 345/98; 345/99

(58) Field of Classification Search
USPC ............................................ 345/76–104, 204
See application file for complete search history.

(56) References Cited

U.S. PATENT DOCUMENTS

| 2006/0061526 A1* | 3/2006 | Shirasaki et al. ............... 345/77 |
| 2008/0007499 A1* | 1/2008 | Kawabe ......................... 345/82 |
| 2008/0042939 A1* | 2/2008 | Yamashita et al. .............. 345/76 |
| 2008/0068516 A1* | 3/2008 | Mori et al. ..................... 348/790 |

FOREIGN PATENT DOCUMENTS

| JP | 2003-005709 | 1/2003 |
| JP | 2006-343768 | 12/2006 |
| JP | 2008-070763 | 3/2008 |
| JP | 2006-106745 | 4/2008 |

* cited by examiner

*Primary Examiner* — Charles V Hicks
*Assistant Examiner* — Jeffrey Steinberg
(74) *Attorney, Agent, or Firm* — Lowe Hauptman & Ham, LLP

(57) ABSTRACT

The invention provides an image display device capable of reducing the transmission delay of a scanning signal. A plurality of scanning signal lines are wired in one pixel circuit row. Pixel circuits of the pixel circuit row are connected to any of the plurality of scanning signal lines.

7 Claims, 7 Drawing Sheets

DISPLAY DEVICE

CROSS-REFERENCE TO RELATED APPLICATION

The present application claims priority from Japanese application JP 2008-149729 filed on Jun. 6, 2008, the content of which is hereby incorporated by reference into this application.

BACKGROUND OF THE INVENTION

Field of the Invention

The present invention relates to an image display device which performs display control for a pixel by using a thin film transistor (TFT).

For example, some image display devices such as liquid crystal display devices or organic EL (Electro Luminescence) display devices perform display control for each pixel by an active matrix system using a thin film transistor (for example, JP-A-2003-5709). In such a display device, pixels are arranged in a matrix, one scanning signal line is arranged in each pixel row in the pixel matrix, and one data signal line (video signal line) is arranged in each pixel column. Further, a pixel circuit is arranged in each pixel for performing display control for the pixel. The pixel circuit includes at least one thin film transistor, is connected to the scanning signal line via the gate electrode of the thin film transistor, and is connected to the data signal line via any one of the source electrode or the drain electrode. In the display device, voltage is applied to a scanning signal line and a data signal line corresponding to a pixel for which the display control is to be performed, so that the ON/OFF of the thin film transistor is controlled to perform the display control for a pixel.

For example, in the case where a large display device in which numeral pixels are arranged is realized by an active matrix system, the transmission delay of a scanning signal occurs in a pixel positioned apart from a scanning signal line drive circuit for inputting a scanning signal to a scanning signal line. As a result, display quality is sometimes reduced. For example, in an organic EL display device, writing of video data is not performed normally because of the transmission delay of a scanning signal in a pixel positioned apart from a scanning signal line drive circuit. As a result, non-uniformity sometimes occurs on a display screen.

SUMMARY OF THE INVENTION

The invention has been made in view of the above problems, and an object of the invention is to provide an image display device capable of reducing the transmission delay of a scanning signal.

In order to overcome the above problems, an image display device according to the invention includes a substrate having pixel circuits arranged in a matrix for performing display control for pixels, in which a plurality of scanning signal lines are wired in one pixel circuit row for the pixel circuits arranged in a matrix, and the pixel circuits in the pixel circuit row are connected to any of the plurality of scanning signal lines.

According to an aspect of the invention, the respective numbers of the pixel circuits connected to the plurality of scanning signal lines may be substantially the same.

According to another aspect of the invention, a first scanning signal line and a second scanning signal line may be wired in one pixel circuit row for the pixel circuits arranged in a matrix. The pixel circuits connected to the first scanning signal line and the pixel circuits connected to the second scanning signal line may be alternatively arranged.

According to further another aspect of the invention, a first scanning signal line and a second scanning signal line may be wired in one pixel circuit row for the pixel circuits arranged in a matrix. The pixel circuits may each include a thin film transistor whose gate electrode is connected to any one of the first scanning signal line and the second scanning signal line. When the substrate is viewed in a plane, a drain electrode, a source electrode, and a semiconductor layer of the thin film transistor may be formed in a region between the first scanning signal line and the second scanning signal line. A projecting portion which projects toward the region between the first scanning signal line and the second scanning signal line may be formed in the first scanning signal line and the second scanning signal line. When the substrate is viewed in a plane, the projecting portion may be formed such that at least a part of the projecting portion and the semiconductor layer overlap each other.

According to still further another aspect of the invention, a first scanning signal line and a second scanning signal line may be wired in one pixel circuit row for the pixel circuits arranged in a matrix. The pixel circuits may each include a thin film transistor whose gate electrode is connected to any one of the first scanning signal line and the second scanning signal line. When the substrate is viewed in a plane, a source electrode and a drain electrode of the thin film transistor may be formed in a region between the first scanning signal line and the second scanning signal line. When the substrate is viewed in a plane, a semiconductor layer of the thin film transistor may be formed such that the semiconductor layer and one of the first scanning signal line and the second scanning signal line overlap each other.

According to the aspects of the invention, the transmission delay of a scanning signal can be decreased.

DESCRIPTION OF THE PREFERRED EMBODIMENTS

Hereinafter, embodiments of the invention will be described in detail based on the drawings. Hereinafter, an example in which the invention is applied to an organic EL display device will be described.

In a display panel of an image display device according to the embodiment, a first electrode (hereinafter defined as anode), an organic EL thin film layer, and a second electrode (hereinafter defined as cathode) are formed above a glass substrate above which thin film transistors TFT are formed.

Figure 1:
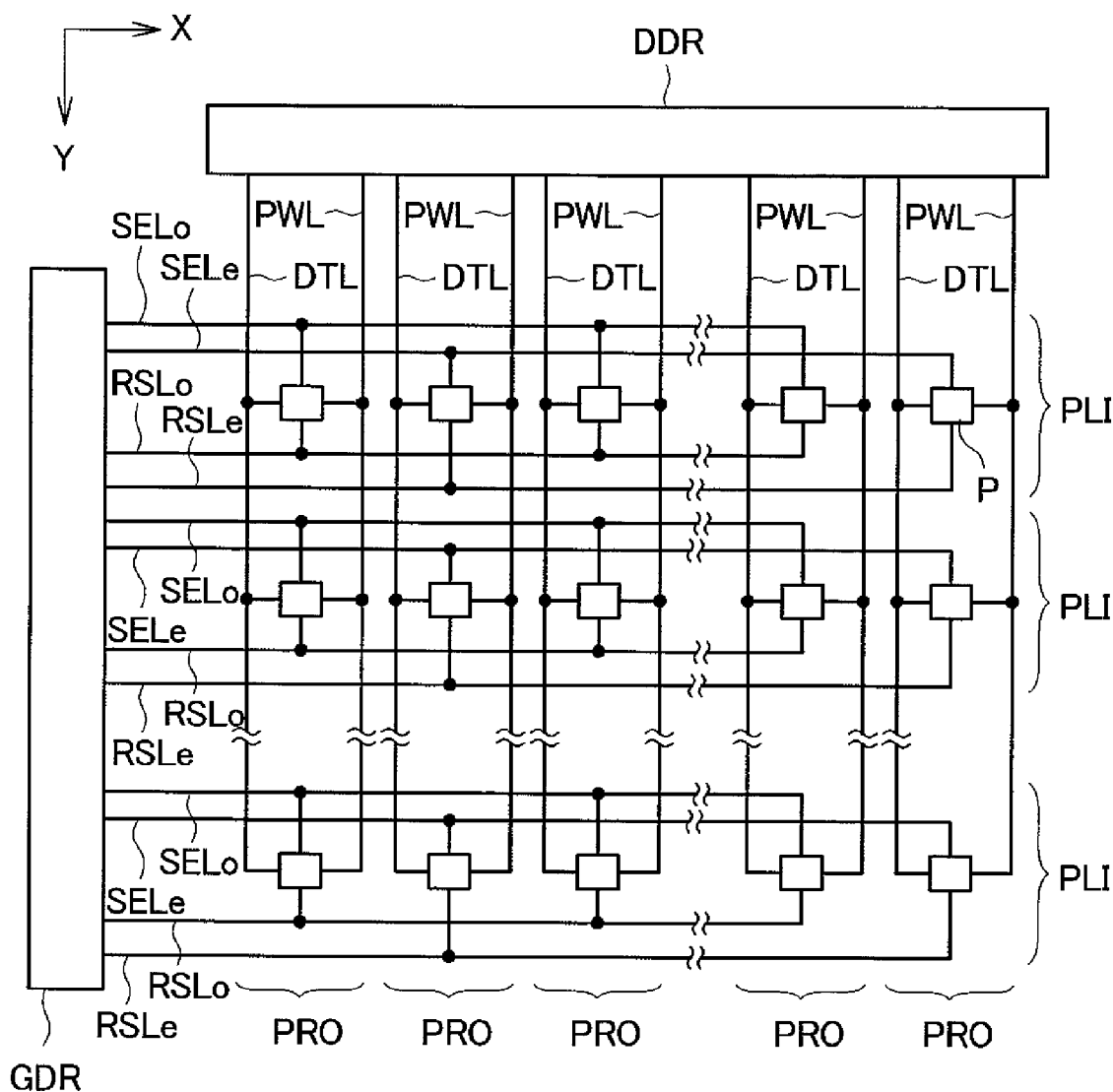
FIG. 1 is a circuit diagram showing the schematic configurations of circuits formed above a substrate of an image display device according to an embodiment of the invention.

FIG. 1 is a circuit diagram showing the schematic configurations of circuits formed above the glass substrate of the image display device according to the embodiment.

As shown in FIG. 1, in the display panel of the image display device according to the embodiment, a plurality of scanning signal lines SELo (first scanning signal lines) and a plurality of scanning signal lines SELe (second scanning signal lines) are arranged above the glass substrate. In an image display region, the scanning signal lines SELo and SELe extend in a first direction (X-direction) substantially in parallel with one another. The scanning signal lines SELo and SELe are connected to a scanning signal line drive circuit GDR. Further, a plurality of reset signal lines RSLo and RSLe which are substantially in parallel with the scanning signal lines SELo and SELe are also arranged above the glass substrate. The reset signal lines RSLo and RSLe extend in the first direction (X-direction) substantially in parallel with one another. Further, the reset signal lines RSLo and RSLe are connected to the scanning signal line drive circuit GDR. Voltage is selectively applied to the scanning signal lines SELo and SELe and the reset signal lines RSLo and RSLe at a predetermined timing by the scanning signal line drive circuit GDR. The scanning signal lines SELo and SELe and the reset signal lines RSLo and RSLe extend in the first direction (X-direction) and are arranged in plural numbers along a second direction (Y-direction) perpendicular to the first direction.

Further, a plurality of data signal lines DTL which are parallel with one another are arranged above the glass substrate so as to be substantially perpendicular to the plurality of scanning signal lines SELo and SELe and the plurality of the reset signal lines RSLo and RSLe as viewed in a plane. A plurality of power supply lines PWL which are parallel with one another are arranged in parallel with the data signal lines DTL so as to be substantially perpendicular to the plurality of scanning signal lines SELo and SELe and the plurality of reset signal lines RSLo and RSLe as viewed in a plane. The data signal lines DTL and the power supply lines PWL are connected to a data signal line drive circuit DDR. Voltage corresponding to image data to be displayed on the image display device is applied to the data signal lines DTL by the data signal line drive circuit DDR at a predetermined timing. The data signal lines DTL and the power supply lines PWL extend in the second direction (Y-direction) and are arranged in plural numbers along the first direction (X-direction).

The vicinities of locations where the scanning signal lines SELo and SELe and the data signal lines DTL intersect one another each correspond to a pixel of the image display device. That is, the scanning signal lines SELo and SELe and the data signal lines DTL define pixels arranged in a matrix individually. In each of pixel regions, a pixel circuit P for performing display control for the pixel is arranged. Hereinafter, lines of pixels (pixel circuits P) in the vertical direction (Y-direction) in FIG. 1 are each called a pixel column PRO (pixel circuit column), while lines of pixels (pixel circuits P) in the horizontal direction (X-direction) are each called a pixel row PLI (pixel circuit row).

In the embodiment, two scanning signal lines SELo and SELe are arranged in each of the pixel rows PLI. The pixel circuits P are connected to any of the scanning signal lines SELo and SELe. Specifically, in each of the pixel rows PLI, pixels are divided into two groups: one group corresponding to the scanning signal line SELo, and the other group corresponding to the scanning signal line SELe. Odd-numbered pixels counted from the side of the scanning signal line drive circuit GDR belong to the group corresponding to the scanning signal line SELo, and their pixel circuits P are connected to the scanning signal line SELo. Even-numbered pixels counted from the side of the scanning signal line drive circuit GDR belong to the group corresponding to the scanning signal line SELe, and their pixel circuits P are connected to the scanning signal line SELe. In the embodiment, therefore, the pixel circuits P connected to the scanning signal line SELo and the pixel circuits P connected to the scanning signal line SELe are alternatively arranged in each of the pixel rows PLI. The number of pixels which belong to the group corresponding to the scanning signal line SELo and the number of pixels which belong to the group corresponding to the scanning signal line SELe are substantially the same in each of the pixel rows PLI.

In the embodiment, two reset signal lines RSLo and RSLe are arranged in each of the pixel rows PLI. The pixel circuits P are connected to any of the reset signal lines RSLo and RSLe. Similarly to the scanning signal line SELo, the odd-numbered pixel circuits P are connected to the reset signal line RSLo. On the other hand, similarly to the scanning signal line SELe, the even-numbered pixel circuits P are connected to the reset signal line RSLe.

Further in the embodiment, one data signal line DTL and one power supply line PWL are arranged in each of the pixel columns PRO.

Figure 2:
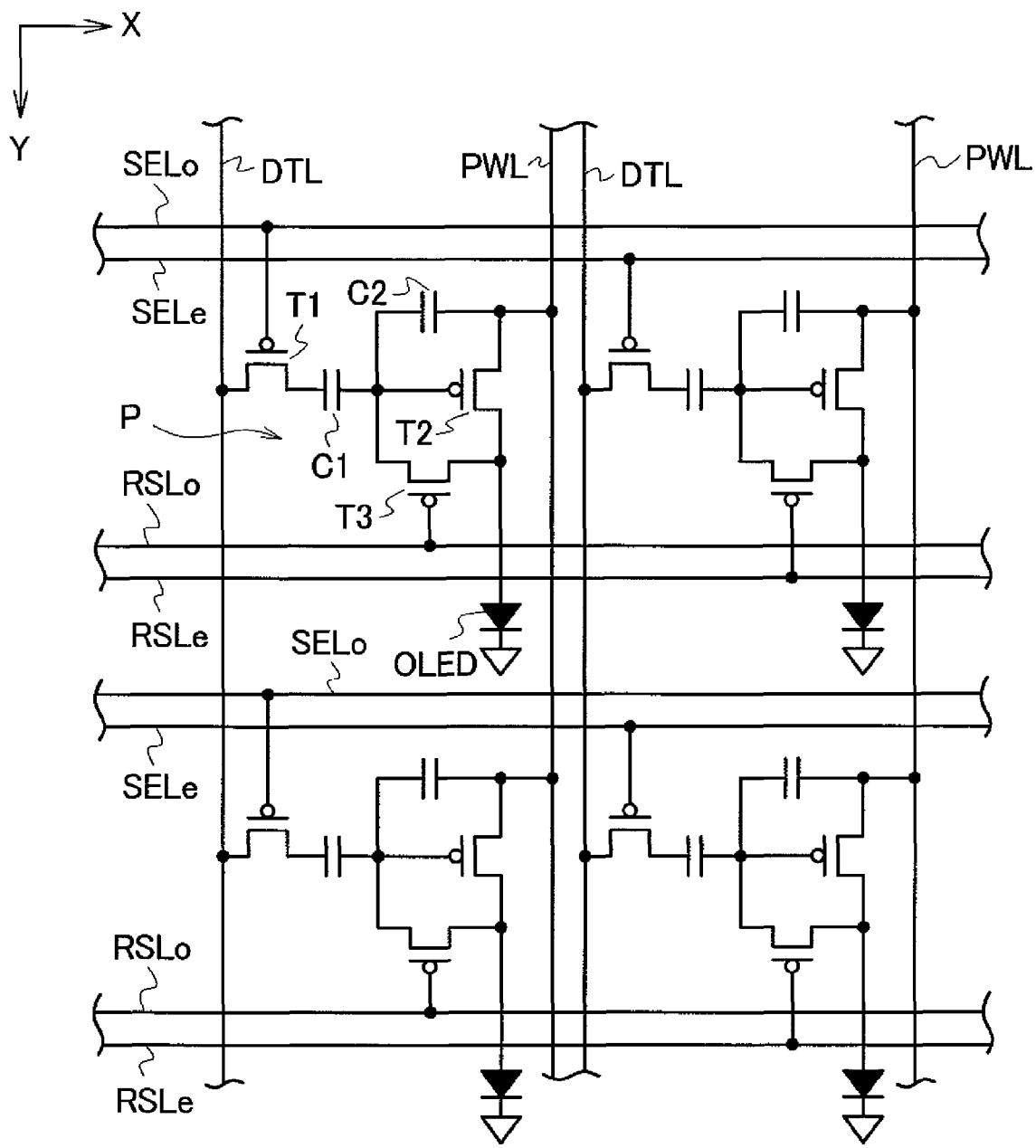
FIG. 2 is a circuit diagram showing the schematic configurations of pixel circuits.
Figure 3:
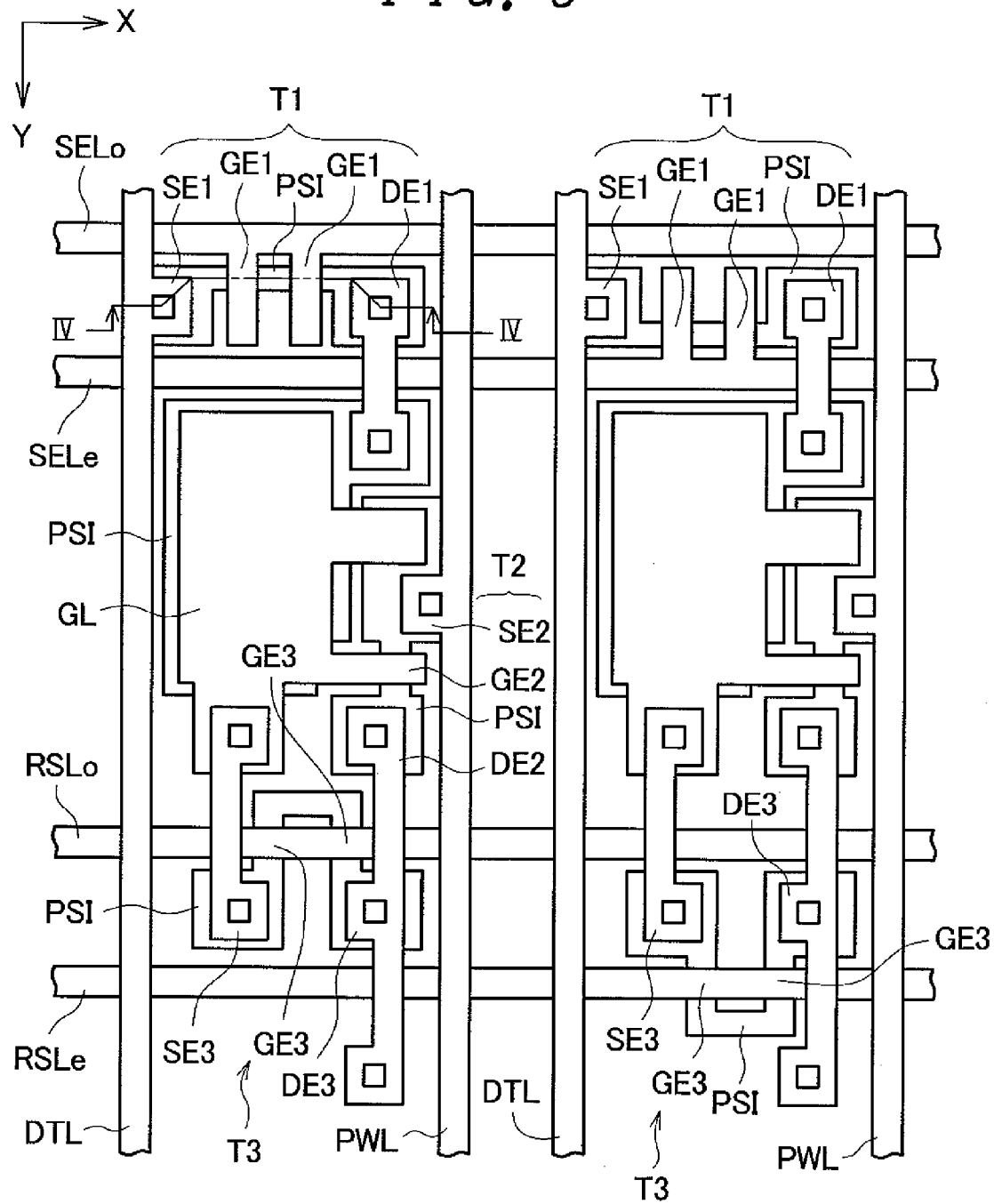
FIG. 3 is a plan view above the substrate, showing an example of the positional relationship among scanning signal lines, data signal lines, and pixel circuits mounted above the substrate.

The pixel circuits P will be described further in detail by using FIGS. 2 and 3. FIG. 2 is a circuit diagram showing the schematic configurations of the pixel circuits P each disposed in each pixel region. FIG. 2 shows four pixel regions adjacent to each other vertically or horizontally. In FIG. 2, upper left and lower left pixel regions of the four pixel regions are odd-numbered pixel regions counted from the side of the scanning signal line drive circuit GDR, while upper right and lower right pixel regions are even-numbered pixel regions counted from the side of the scanning signal line drive circuit GDR. FIG. 3 is a plan view above the glass substrate, showing the positional relationship among the scanning signal lines SELo and SELe, the data signal lines DTL, and the pixel circuits P mounted above the glass substrate. FIG. 3 shows two pixel regions horizontally adjacent to each other. In FIG. 3, reference sign "GL" denotes a gate wiring. Further in FIG. 3, the left pixel region between the two pixel regions is an odd-numbered pixel region counted from the side of the scanning signal line drive circuit GDR, while the right pixel region is an even-numbered pixel region counted from the side of the scanning signal line drive circuit GDR.

As shown in FIGS. 2 and 3, each of the pixel circuits P includes a first thin film transistor T1, a second thin film transistor T2, a third thin film transistor T3, a storage capacitor C1, an auxiliary capacitor C2, and an organic light emitting diode element OLED. The first thin film transistor T1, the second thin film transistor T2, and the third thin film transistor T3 are p-channel polycrystalline silicon thin film transistors. The organic light emitting diode element OLED is sometimes called an organic EL (electro-luminescent) element.

Gate electrodes GE1 of the first thin film transistors T1 are connected to any of the scanning signal lines SELo and SELe. In each of the pixel rows PLI, the gate electrodes GE1 of the first thin film transistors T1 of the odd-numbered pixel circuits P are connected to the scanning signal line SELo, while the gate electrodes GE1 of the first thin film transistors T1 of the even-numbered pixel circuits P are connected to the scanning signal line SELe. Any one of a source electrode SE1 and a drain electrode DE1 (source electrode SE1 in this case) of the first thin film transistor T1 is connected to the data signal line DTL.

As shown in FIG. 3, the first thin film transistor T1 is formed such that the source electrode SE1, the drain electrode DE1, and a the semiconductor layer PSI of the first thin film transistor T1 are positioned in a region between the scanning signal line SELo and the scanning signal line SELe as viewed in a plane. Projecting portions which project toward the region between the scanning signal lines SELo and SELe are formed so as to overlap the semiconductor layer PSI in the scanning signal lines SELo and SELe. The projecting portions function as the gate electrodes GE1 of the first thin film transistor T1.

Figure 4:
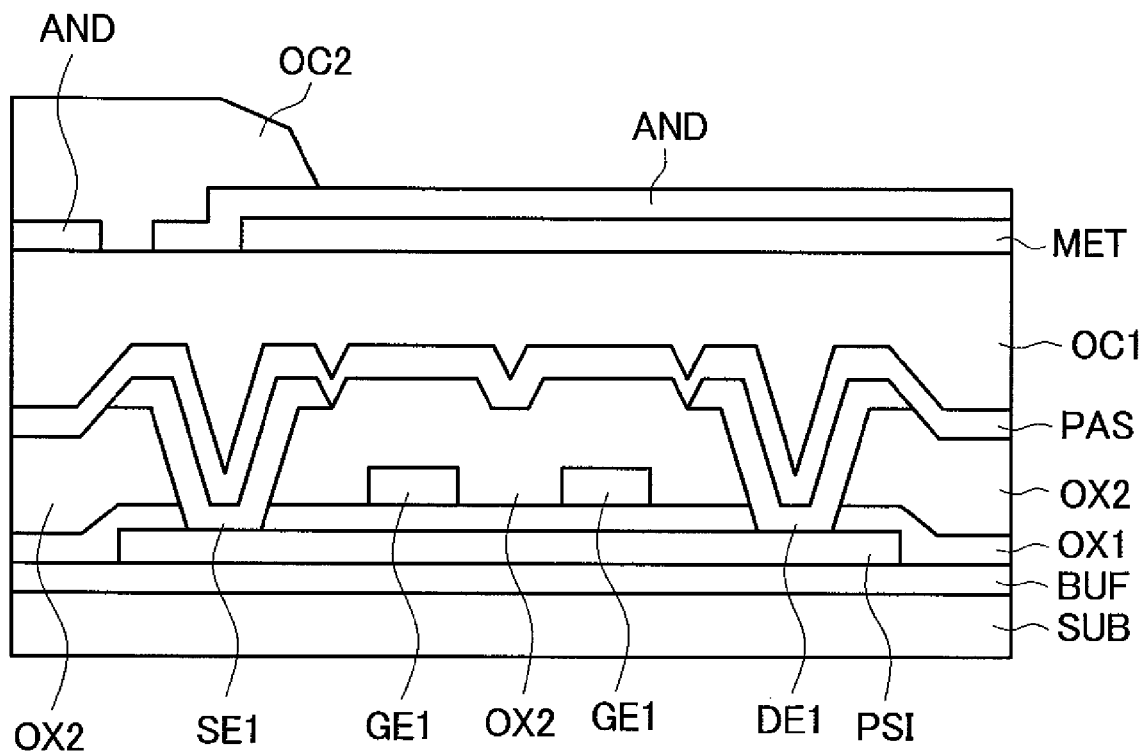
FIG. 4 is a partial cross-sectional view of the substrate.

FIG. 4 is a partial cross-sectional view showing the state of a cross section of the glass substrate taken along line IV-IV in FIG. 3. That is, FIG. 4 shows the state of the cross section of the glass substrate at a location where the first thin film transistor T1 is formed. As shown in FIG. 4, a buffer layer BUF, the semiconductor layer PSI, a gate insulating film OX1, a gate wiring layer, an inter-layer insulating film OX2, a source/drain wiring layer, a protective insulating film PAS, a planarization film OC1, a reflective metal layer MET, an anode layer AND, and a planarization film OC2 are successively stacked on a glass substrate SUB. The buffer layer BUF includes silicon oxide. The semiconductor layer PSI includes, for example, polysilicon. The gate wiring layer includes the gate electrodes GE1, the gate wiring GL, the scanning signal lines SELo and SELe, and the like. The source/drain wiring layer includes the source electrode SE1, the drain electrode DE1, the data signal line DTL, and the like. The stacked structure described above is formed by using, for example, photolithography technology.

As shown in FIGS. 2 and 3, gate electrodes GE3 of the third thin film transistors T3 are connected to the reset signal line RSLo or RSLe. In each of the pixel rows PLI, the gate electrodes GE3 of the third thin film transistors T3 of the odd-numbered pixel circuits P are connected to the reset signal line RSLo, while the gate electrodes GE3 of the third thin film transistors T3 of the even-numbered pixel circuits P are connected to the reset signal line RSLe.

As shown in FIG. 3, the third thin film transistor T3 is formed such that a source electrode SE3 and a drain electrode DE3 of the third thin film transistor T3 is positioned in a region between the reset signal line RSLo and the reset signal line RSLe as viewed in a plane. Further, the semiconductor layer PSI is formed so as to intersect any one of the reset signal lines RSLo and RSLe when the substrate is viewed in a plane. Locations of the reset signal lines RSLo and RSLe intersecting the semiconductor layer PSI function as the gate electrodes GE3 of the third thin film transistors T3.

As shown in FIGS. 2 and 3, the data signal lines DTL is connected to the storage capacitor C1 via the first thin film transistor T1. The other end of the storage capacitor C1 is connected to a gate electrode GE2 of the second thin film transistor T2 and the source electrode SE3 of the third thin film transistor T3. The gate electrode GE2 of the second thin film transistor T2 is connected to a source electrode SE2 of the second thin film transistor T2 via the auxiliary capacitor C2. The source electrode SE2 of the second thin film transistor T2 is connected to the power supply line PWL. The drain electrode DE2 of the second thin film transistor T2 and the drain electrode DE3 of the third thin film transistor T3 are connected to one end of the organic light emitting diode element OLED. The other end of the organic light emitting diode element OLED is connected to a common ground terminal (cathode).

Figure 5:
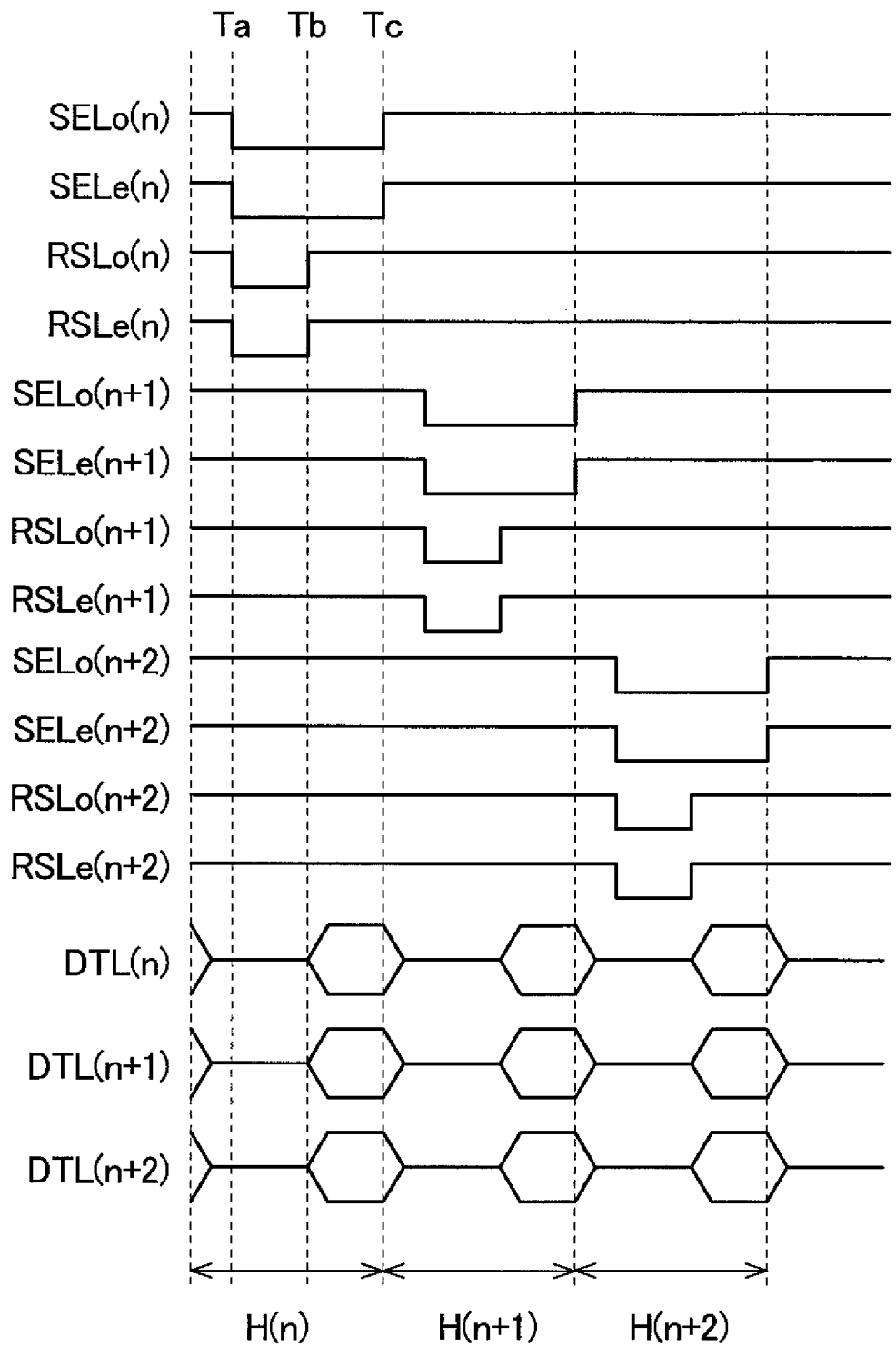
FIG. 5 shows signal waveforms of scanning signal lines, reset signal lines, and data signal lines.

Here, signals to be input to the scanning signal lines SELo and SELe and the reset signal lines RSLo and RSLe, and the operation of the pixel circuit P will be described. FIG. 5 shows signal waveforms of the scanning signal lines SELo and SELe, the reset signal lines RSLo and RSLe, and the data signal line DTL. FIG. 5 mainly shows the signal waveforms of the respective signal lines in three horizontal periods H(n), H(n+1), and H(n+2). In FIG. 5, reference signs SELo(n) and SELe (n) respectively denote the scanning signal lines SELo and SELe corresponding to an nth pixel row PLI, and reference signs RSLo (n) and RSLe (n) respectively denote the reset signal lines RSLo and RSLe corresponding to the nth pixel row PLI. The term "nth pixel row PLI" as used herein refers to the nth pixel row PLI counted from the side of the data signal line drive circuit DDR in FIG. 1. Also in FIG. 5, reference sign DTL(n) denotes the data signal line DTL corresponding to an nth pixel column PRO. The term "nth pixel column PRO" as used herein refers to the nth pixel column PRO counted from the side of the scanning signal line drive circuit GDR in FIG. 1.

First, signals to be input to the scanning signal lines SELo and SELe and the reset signal lines RSLo and RSLe will be described. As shown in FIG. 5, the same signal is input to both the scanning signal lines SELo(n) and SELe (n) corresponding to the nth pixel row PLI. In this manner, the same signal is input to the scanning signal lines SELo and SELe corresponding to the same pixel row PLI. As shown in FIG. 5, the same signal is input to both the reset signal lines RSLo(n) and RSLe(n) corresponding to the nth pixel row PLI. In this manner, the same signal is input to the reset signal lines RSLo and RSLe corresponding to the same pixel row PLI.

Next, the operation of the pixel circuit P will be described. In the first horizontal period H(n) shown in FIG. 5, the nth pixel row PLI is selected, so that the luminance of the organic light emitting diode elements OLED in the nth pixel row PLI is updated.

Specifically, voltages of the scanning signal lines SELo(n) and SELe (n) and the reset signal lines RSLo(n) and RSLe(n) corresponding to the nth pixel row PLI are first reduced (Ta in FIG. 5). As described above, since the first thin film transistor T1 has a p-channel structure, the first thin film transistor T1 is brought into an ON state when the voltages of the scanning signal lines SELo(n) and SELe (n) fall down. In the same manner, since the third thin film transistor T3 has also the p-channel structure, the third thin film transistor T3 is also brought into the ON state when the voltages of the reset signal lines RSLo(n) and RSLe(n) fall down. When the third thin film transistor T3 is brought into the ON state, the accumulated charge of the storage capacitor C1 is discharged, and the storage capacitor C1 prepares for an input of the next data signal voltage.

Thereafter, the voltages of the reset signal lines RSLo (n) and RSLe(n) are increased, so that the third thin film transistor T3 is returned to an OFF state (Tb in FIG. 5). Then, a data signal voltage is input to each of the data signal lines DTL. The data signal voltage to be input to each of the data signal lines DTL is set for each of the data signal lines DTL based on image data to be displayed on the image display device. The data signal voltage is written in the storage capacitor C1 via the first thin film transistor T1 in the ON state.

The data signal voltage written in the storage capacitor C1 is input to the second thin film transistor T2. As a result, a drive current corresponding to the data signal voltage written in the storage capacitor C1 is input to the organic light emitting diode element OLED via the second thin film transistor T2. The organic light emitting diode element OLED starts to emit light at a luminance corresponding to the data signal voltage written in the storage capacitor C1.

Thereafter, the voltages of the scanning signal lines SELo(n) and SELe(n) are increased, so that the first thin film transistor T1 is returned to the OFF state (Tc in FIG. 5). In this case, the data signal voltage written in the storage capacitor C1 remains to be stored in the storage capacitor C1 even after the first thin film transistor T1 is brought into the OFF state. Therefore, the data signal voltage written in the storage capacitor C1 is continuously input to the second thin film transistor T2, so that the organic light emitting diode element OLED continues to emit light at the luminance corresponding to the data signal voltage written in the storage capacitor C1.

In the same manner, in the next horizontal period H(n+1), an (n+1)th pixel row PLI is selected, so that the luminance of the organic light emitting diode elements OLED in the (n+1)th pixel row PLI is updated. In the further next horizontal period H(n+2), an (n+2)th pixel row PLI is selected, so that the luminance of the organic light emitting diode elements OLED in the (n+2)th pixel row PLI is updated.

The image display device according to the embodiment can reduce the transmission delay of a scanning signal as will be described below. A transmission time t for a scanning signal is represented by the product of a capacitance C generated in a scanning signal line and a resistance R of the scanning signal line, that is, t=C*R. As the capacitance C generated in a scanning signal line, there are "a gate capacitance of a thin film transistor", "a parasitic capacitance generated at an intersecting portion of the scanning signal line and other layer", and "a parasitic capacitance generated between wirings in the same layer". Since "a gate capacitance of a thin film transistor" is large compared with the other two capacitances, most of the capacitance C generated in a scanning signal line is occupied by "a gate capacitance of a thin film transistor". In this regard, in the image display device according to the embodiment, two scanning signal lines SELo and SELe are wired in each of the pixel rows PLI. In each of the pixel rows PLI, the pixel circuits P are divided into the two groups: one group in which the pixel circuits P are connected to the scanning signal line SELo, and the other group in which the pixel circuits P are connected to the scanning signal line SELe. Therefore, the number of the pixel circuits P (first thin film transistors T1) connected to each of the scanning signal lines is reduced in the embodiment compared with the case where one scanning signal line is wired in each of the pixel rows PLI. Therefore, "a gate capacitance of a thin film transistor" of each scanning signal line is also reduced. Specifically, in each of the pixel rows PLI, the odd-numbered pixel circuits P are connected to the scanning signal line SELo, while the even-numbered pixel circuits P are connected to the scanning signal line SELe. Therefore, the number of the pixel circuits P (first thin film transistors T1) connected to each scanning signal line is reduced to a half compared with the case where one scanning signal line is wired in each of the pixel rows PLI. Therefore, "a gate capacitance of a thin film transistor" of each scanning signal line is also reduced to a half. As a result, the transmission time t for a scanning signal is shortened to improve the transmission delay of a scanning signal.

In the image display device according to the embodiment, two reset signal lines RSLo and RSLe are wired in each of the pixel rows PLI, and therefore, the transmission delay of a signal is also improved for the reset signal lines similarly to the scanning signal lines.

In the image display device according to the embodiment, in each of the pixel rows PLI, the number of the pixel circuits P connected to the scanning signal line SELo and the number of the pixel circuits P connected to the scanning signal line SELe are substantially the same. With this configuration, it is intended that the transmission time (transmission delay) of a scanning signal be substantially the same between the scanning signal line SELo and the scanning signal line SELe.

In the image display device according to the embodiment, in each of the pixel rows PLI, the pixel circuits P connected to the scanning signal line SELo and the pixel circuits P connected to the scanning signal line SELe are alternatively arranged. With this configuration, in each of the pixel rows PLI, it is intended that the transmission time (transmission delay) of a scanning signal be substantially the same between adjacent pixels.

In the image display device according to the embodiment, when the substrate is viewed in a plane, the drain electrode DE1, the source electrode SE1, and the semiconductor layer PSI of the first thin film transistor T1 are formed in the region between the scanning signal line SELo and the scanning signal line SELe. Further, when the substrate is viewed in a plane, the scanning signal lines SELo and SELe have projecting portions which project toward the region between the scanning signal line SELo and the scanning signal line SELe. The projecting portions are each formed such that at least a part of the projecting portion and the semiconductor layer overlap each other when the substrate is viewed in a plane, so that the projecting portions function as the gate electrodes GE1 of the first thin film transistors T1. In the image display device according to the embodiment, it is necessary to form two kinds of first thin film transistors T1, that is, the first thin film transistor T1 connected to the scanning signal line SELo, and the first thin film transistor T1 connected to the scanning signal line SELe, above the substrate. In this regard, with the configuration described above, it is possible to reduce the space for forming the two kinds of first thin film transistors T1.

In the image display device according to the embodiment, when the substrate is viewed in a plane, the drain electrode DE3 and the source electrode SE3 of the third thin film transistor T3 are formed in the region between the reset signal line RSLo and the reset signal line RSLe. The semiconductor layer PSI of the third thin film transistor T3 is formed so as to overlap one of the reset signal line RSLo and the reset signal line RSLe when the substrate is viewed in a plane. The locations of the reset signal line RSLo or the reset signal line RSLe overlapping the semiconductor layer PSI function as the gate electrodes GE3 of the third thin film transistor T3. In the image display device according to the embodiment, it is necessary to form two kinds of third thin film transistors T3, that is, the third thin film transistor T3 connected to the reset signal line RSLo and the third thin film transistor T3 connected to the reset signal line RSLe. In this regard, with the configuration described above, it is possible to reduce the space for forming the two kinds of third thin film transistors T3.

The invention is not limited the above-described embodiment.

Figure 6:
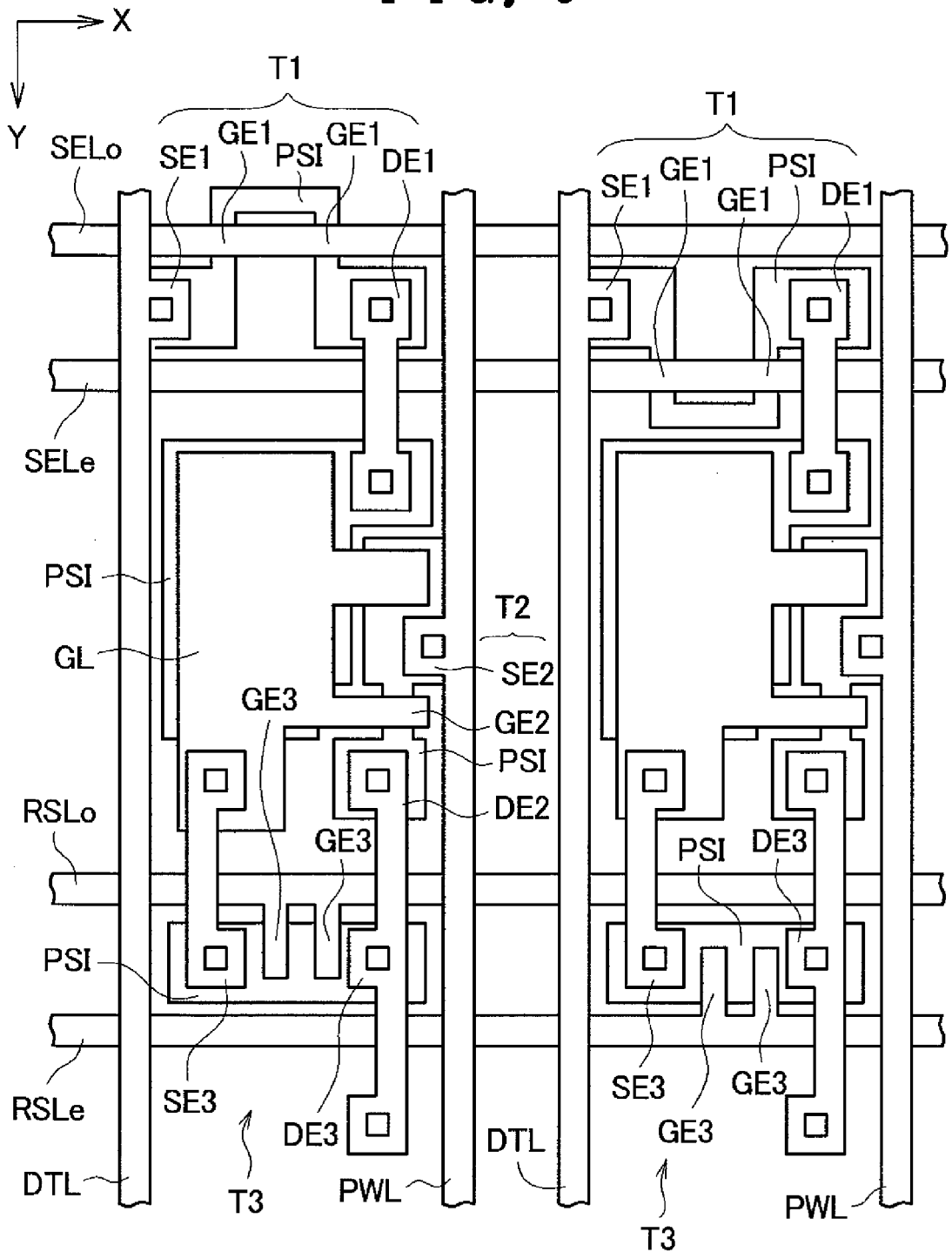
FIG. 6 is a plan view above the substrate, showing an example of the positional relationship among scanning signal lines, data signal lines, and pixel circuits mounted above the substrate.

For example, the form of the gate electrodes GE1 of the first thin film transistor T1 is not limited to the form shown in FIG. 3. For example, the gate electrodes GE1 of the first thin film transistor T1 may be formed in the same manner as the gate electrodes GE3 of the third thin film transistor T3 in FIG. 3. That is, as shown in FIG. 6, the semiconductor layer PSI may be formed so as to intersect any one of the scanning signal lines SELo and SELe when the substrate is viewed in a plane. Locations of the scanning signal line SELo or SELe intersecting the semiconductor layer PSI may function as the gate electrodes GE1 of the first thin film transistor T1. Also with this configuration, it is possible to reduce the space for forming the two kinds of first thin film transistors T1, that is, the first thin film transistor T1 connected to the scanning signal line SELo and the first thin film transistor T1 connected to the scanning signal line SELe.

For example, the form of the gate electrodes GE3 of the third thin film transistor T3 is not limited to the form shown in FIG. 3. For example, the gate electrodes GE3 of the third thin film transistor T3 may be formed in the same manner as the gate electrodes GE1 of the first thin film transistor T1 in FIG. 3. That is, as shown in FIG. 6, projecting portions which project toward the region between the reset signal lines RSLo and RSLe may be formed in the reset signal lines RSLo and RSLe so as to overlap the semiconductor layer PSI positioned in the region between the reset signal lines RSLo and RSLe. The projecting portions may function as the gate electrodes GE3 of the third thin film transistor T3. Also with this configuration, it is possible to reduce the space for forming the two kinds of third thin film transistors T3, that is the third thin film transistor T3 connected to the reset signal line RSLo and the third thin film transistor T3 connected to the reset signal line RSLe.

For example, in the above description, the pixels are divided into two groups of the odd-numbered pixel group and the even-numbered pixel group in each of the pixel rows PLI. However, how to divide the pixels into groups is not limited thereto. For example, in the case where there are N pixels in one pixel row PLI, the pixels may be divided into two groups: one group of the first to (N/2)th pixels, and the other group of (N/2+1)th to Nth pixels, counted from the side of the scanning signal line drive circuit GDR. In this case, for example, the pixel circuits P of the first to (N/2)th pixels may be connected to the scanning signal line SELo and the reset signal line RSLo, while the pixel circuits P of the (N/2+1)th to Nth pixels may be connected to the scanning signal line SELe and the reset signal line RSLe.

For example, three or more scanning signal lines may be wired in each of the pixel rows PLI. Similarly, three or more reset signal lines may be wired in each of the pixel rows PLI. In this case, pixels are divided into three or more groups in each of the pixel rows PLI.

For example, the invention can also be applied to display devices other than the organic EL display device. The invention can be applied to an active matrix system display device. For example, the invention can be applied to an active matrix system liquid crystal display device.

Figure 7:
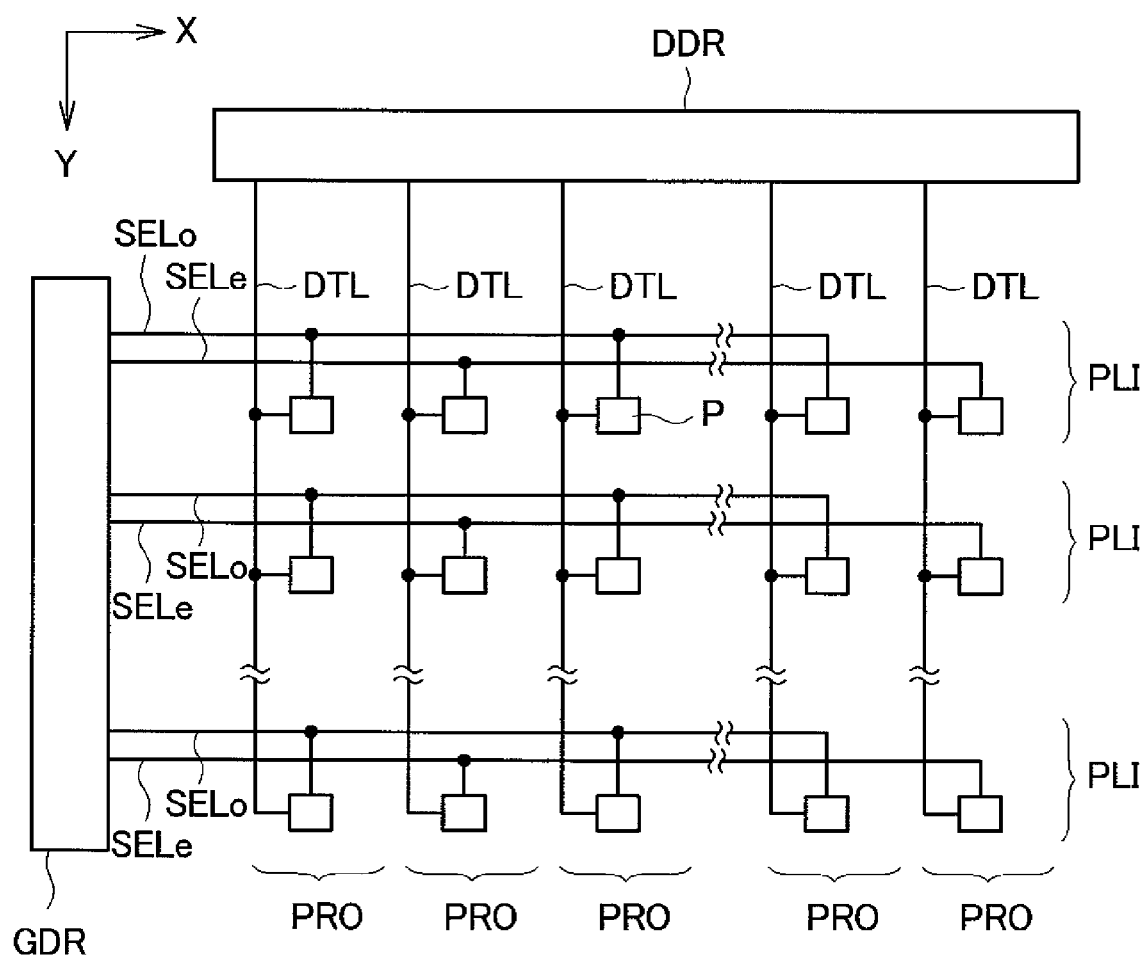
FIG. 7 is a circuit diagram showing the schematic configurations of circuits formed above a substrate of an image display device according to another embodiment of the invention.

FIG. 7 shows an example in which the invention is applied to an active matrix system liquid crystal display device. FIG. 7 is a circuit diagram showing the schematic circuit configuration of a display panel of the liquid crystal display device. In the example shown in FIG. 7, two scanning signal lines SELo and SELe are disposed in each of the pixel rows PLI. In each of the pixel rows PLI, the pixel circuits P of odd-numbered pixels are connected to one scanning signal line SELo, while the pixel circuits P of even-numbered pixels are connected to the other scanning signal line SELe. With this configuration, also in the active matrix system liquid crystal display device, the transmission delay of a scanning signal can be decreased. The invention can also be applied to the so-called IPS (In Plane Switching) system liquid crystal display device, and also to the so-called VA (Vertical Alignment) or TN (Twisted Nematic) system liquid crystal display device.

What is claimed is:

1. An image display device comprising:
    a substrate including pixel circuits arranged in a matrix of pixel circuit rows and pixel circuit columns for performing display control for pixels, each of the pixel circuits including a first thin film transistor, a storage capacitor, a second thin film transistor and an organic light emitting diode element; and
    a plurality of scanning signal lines wired in one of the pixel circuit rows, which one pixel circuit row includes a plurality of said pixel circuits,
    wherein:
    the storage capacitor of each of the pixel circuits has one end connected to a data signal line via the first thin film transistor of the pixel circuit and another end connected to a gate electrode of the second thin film transistor of the pixel circuit,
    a source electrode of the second thin film transistor is connected to a power supply line,
    one end of the organic light emitting diode element is connected to the second thin film transistor and another end of the organic light emitting diode is connected to a common ground electrode,
    the first thin film transistor of a first one of the pixel circuits in the one pixel circuit row is connected to one of the plurality of scanning signal lines wired in the one pixel circuit row while the first thin film transistor of a second one of the pixel circuits in the one pixel circuit row is connected to a different one of the plurality of scanning signal lines wired in the one pixel circuit row, and
    two reset signal lines are arranged in said one of the pixel circuit rows, wherein the first one of the pixel circuits in the one pixel circuit row is connected to one of the two reset signal lines, and the second one of the pixel circuits in the one pixel circuit row is connected to the other one of the two reset signal lines,
    wherein the plurality of scanning signal lines and the two reset signal lines are configured and arranged relative to first and second one of the pixel circuits to reduce transmission delay of signals on the scanning signals lines and the reset signal lines to the first and second one of the pixel circuits.

2. The image display device according to claim 1, wherein a first scanning signal line and a second scanning signal line are wired in one pixel circuit row for the pixel circuits arranged in a matrix, and
    the pixel circuits connected to the first scanning signal line and the pixel circuits connected to the second scanning signal line are alternatively arranged.

3. The image display device according to claim 1, wherein a first scanning signal line and a second scanning signal line are wired in one pixel circuit row for the pixel circuits arranged in the matrix,
    the pixel circuits each include the first thin film transistor whose gate electrode is connected to the first scanning signal line or the second scanning signal line,
    when the substrate is viewed in a plane, a drain electrode, a source electrode, and a semiconductor layer of the first thin film transistor are formed in a region between the first scanning signal line and the second scanning signal line,
    a projecting portion which projects toward the region between the first scanning signal line and the second scanning signal line is formed in the first scanning signal line and the second scanning signal line, and
    when the substrate is viewed in a plane, the projecting portion is formed such that at least a part of the projecting portion and the semiconductor layer overlap each other.

4. The image display device according to claim 1, wherein
a first scanning signal line and a second scanning signal line are wired in one pixel circuit row for the pixel circuits arranged in the matrix,
the pixel circuits each include the first thin film transistor whose gate electrode is connected to the first scanning signal line or the second scanning signal line,
when the substrate is viewed in a plane, a source electrode and a drain electrode of the first thin film transistor are formed in a region between the first scanning signal line and the second scanning signal line, and
when the substrate is viewed in a plane, a semiconductor layer of the first thin film transistor is formed such that the semiconductor layer and one of the first scanning signal line and the second scanning signal line overlap each other.

5. The image display device according to claim 1, wherein the respective numbers of the pixel circuits connected to the plurality of scanning signal lines are substantially the same.

6. The image display device according to claim 1, wherein, for each of the pixel circuits formed in the one pixel circuit row, the pixel circuit is connected to one of the plurality of scanning signal lines via a gate of the first thin film transistor of the pixel circuit.

7. The image display device according to claim 1, wherein a gate electrode of the first thin film transistor of the first one of the pixel circuits is connected to said one of the plurality of scanning signal lines and wherein a gate electrode of the first thin film transistor of the second one of the pixel circuits is connected to said different one of the plurality of scanning signal lines.

* * * * *